United States Patent [19]

Saito

[11] Patent Number: 5,458,689
[45] Date of Patent: Oct. 17, 1995

[54] APPARATUS AND METHOD FOR GROWING SEMICONDUCTOR CRYSTAL

[75] Inventor: Junji Saito, Kawasaki, Japan

[73] Assignee: Fujitsu Limited, Kawasaki, Japan

[21] Appl. No.: 384,389

[22] Filed: Feb. 3, 1995

Related U.S. Application Data

[63] Continuation of Ser. No. 713, Jan. 5, 1993, abandoned.

[30] Foreign Application Priority Data

Jan. 7, 1992 [JP] Japan .................................. 4-000544

[51] Int. Cl.$^6$ ................................................. C23C 16/00
[52] U.S. Cl. ........................... 118/724; 118/715; 118/725
[58] Field of Search ..................................... 118/715, 724, 118/725

[56] References Cited

U.S. PATENT DOCUMENTS

| | | | |
|---|---|---|---|
| 3,098,763 | 7/1963 | Deal | 118/725 |
| 3,916,822 | 11/1975 | Robinson | 118/724 |
| 4,774,416 | 9/1988 | Askary | 118/715 |
| 4,951,603 | 8/1990 | Yoshino | 118/725 |

FOREIGN PATENT DOCUMENTS

| | | |
|---|---|---|
| 3715644 | 12/1988 | Germany . |
| 63-134596 | 6/1988 | Japan . |
| 63-226915 | 9/1988 | Japan . |
| 9010092 | 9/1990 | WIPO . |

OTHER PUBLICATIONS

Solid state technology/Feb. 1990, pp. 21–27.
J. Vac. Sci. Technol. B4(1), Jan./Feb. 1986 "Epitaxial growth from organometallic sources in high vacuum" pp. 22–29.
Journal of Crystal Growth 105 (1990) "High throughout vacuum chemical epitaxy" pp. 35–45.

*Primary Examiner*—Richard Bueker
*Attorney, Agent, or Firm*—Armstrong, Westerman, Hattori, McLeland and Naughton

[57] ABSTRACT

The present invention relates to molecr beam epitaxy, in particular, to a gas source molecular beam epitaxy apparatus using compound gases as sources of semiconductor component elements, and also relates to a method for growing semiconductor crystal using this apparatus. It is an object of the present invention to prevent an epitaxial layer from being contaminated with organic compounds produced by decomposition of source gases. It is another object to grow a high purity semiconductor crystal at a growth rate high enough for practical applications. To achieve the above objects, in a growth apparatus in accordance with the present invention, the ambient gas pressure is maintained at the order of $10^{-5}$–$10^{-3}$ Torr during a growing process. The distance between a substrate on which semiconductor is to be grown and a gas effusion cell made shorter than the mean free path of source gases and by-products produced by decomposition of the source gases, wherein the mean free path is determined from the above ambient gas pressure. Moreover, a heat insulation plate is provided between the gas effusion cell and the substrate, wherein the heat insulation plate has apertures corresponding to gas effusion cells. Furthermore, as source gases, amino compounds are used such as trimethyl amine galane (($CH_3$)$_3$N.GaH$_3$), triethyl amine alane (($C_2H_5$)$_3$N), tris-dimethylamino arsine (As (N($CH_3$)$_2$)$_3$), trimethyl amine ilane (($CH_3$)$_3$N.InH$_3$), and tris-diethylamino phosphine (P (N ($C_2H_5$)$_2$)$_3$), wherein the amino compounds include elements composing compound semiconductor such as GaAs and InP.

13 Claims, 4 Drawing Sheets

APPARATUS AND METHOD FOR GROWING SEMICONDUCTOR CRYSTAL

This application is a continuation of application Ser. No.08/000,713 filed Jan. 5, 1993, now abandoned.

FIELD OF THE INVENTION

The present invention relates to molecular beam epitaxy, in particular, to an apparatus for gas source molecular beam epitaxy (GSMBE) which uses compound gas source including, as its component, elements composing compound semiconductor, and also to a method for growing semiconductor crystal using this apparatus.

Molecular beam epitaxy (MBE) has attracted much attention because it permits high precision growth of an extremely thin semiconductor layer consisting of desired component elements, wherein the thickness of the grown layer is as thin as atomic layers, and it also permits to form a heterojunction with an abrupt interface. These features of this technology are expected to facilitate development of practicable electronic or optical devices which operate based on quantum effects.

BACKGROUND OF THE INVENTION

One known method used broadly for supplying a molecular beam source material is to evaporate an element semiconductor material. Recently, in contrast to that, new technology called gas source molecular beam epitaxy (GSMBE) was introduced, in which organic compound gases including component elements of semiconductor are supplied from the outside of the apparatus. FIG. 5 is a schematic diagram showing a construction of a conventional GSMBE apparatus.

In a crystal growth chamber 1, as well as a metal-source type effusion cell 5 for spouting an evaporated element source material, gas-source type gas cells 22A and 22B for spouting metal organic source gases are provided.

Moreover, in the crystal growth chamber 1, a substrate 2 on which crystal is to be grown, a substrate holder 3 for supporting the substrate 2, a liquid nitrogen shroud 6 for cooling the inner wall of the crystal growth chamber 1, and shutters for turning on or off molecular beams from each cell are also provided.

The crystal growth chamber 1 is connected to a gate valve 23 for use when the substrate 2 is replaced by another substrate located outside. A turbo molecular pump 12 is provied for evacuating the crystal growth chamber 1 to ultra high vacuum via gate valve 24. Furthermore, source gas bombs 33A and 33B are connected to the crystal growth chamber 1 via stop valves 31A, 31B, 34A, and 34B, and mass flow controller 32A and 32B. A member marked 4 is a manipulator for supporting the substrate 2, while an oil trap and rotary pump are denoted by 13 and 14, respectively.

In a GSMBE method, unlike a method which uses metal-source type effusion cells, supply of source materials can be carried out without opening a vacuum chamber. Thus, operation efficiency of the growth apparatus can be improved and the apparatus can be effectively used for mass production.

DESCRIPTION OF THE RELATED PRIOR ART

In general, in a conventional GSMBE method, metal organic compound gases are used for source gases. For example, when a GaAs epitaxial layer is grown on a GaAs single crystal substrate, trimethyl gallium (Ga(CH$_3$)$_3$, hereafter referred to as TMG) or triethyl gallium (Ga(C$_2$H$_5$)$_3$, referred to as TEG) are used for a gallium (Ga) source. TMG or TEG introduced into a vacuum chamber decomposes when it comes into contact with a GaAs substrate heated to a predetermined temperature, then it reacts with arsenic (As) to produce GaAs.

When TMG or TEG decomposes, methyl free radicals or ethyl free radicals are produced and some parts of these radicals further pyrolytically decompose to liberate atomic carbon (C) . Carbon atoms generated in this way are incorporated into a growing GaAs epitaxial layer. These carbon atoms included in the GaAs epitaxial layer act as acceptors, thus GaAs layer becomes to exhibit p-type conductivity which is undesirable for applications requiring a non-doped GaAs layer.

It is known that the concentration of carbon which is incorporated into a growing GaAs layer during growth by the conventional GSMBE method described above strongly depends on the substrate temperature and the intensity ratio of molecular beams between TMG and AsH$_3$ (Refer, for example, to T. H. Chiu et al., Appl. Phys. Lett. Vol.51 (1987) pp.1109–1111). Therefore, in order to grow a high purity GaAs crystal with no contamination of carbon, it is needed to precisely control the substrate temperature and the intensity ratio of molecular beams between the source materials, and furthermore a low growth rate is required.

As described above, the conventional GSMBE method has disadvantages such as difficulty in growing a high purity GaAs layer that can be regarded as non-doped, also difficulty in controlling required growth conditions. Another disadvantage is that the growth should be done at a low growth rate. These disadvantages prevent this technology from being broadly used for practical use.

It has been reported that when an AlGaAs epitaxial layer is grown by a GSMBE method, if trimethyl amine alane ((CH$_3$)$_3$N.AlH$_3$) is used as an aluminum source gas, the carbon concentration in the epitaxial layer can be reduced (C. R. Abernathy et al., "Growth of high quality AlGaAs by metalorganic molecular beam epitaxy using trimethylamine alane" Apply. Phys. Lett. 56, pp.2654–2656 (1990)).

In general, triethyl aluminum ((C$_2$H$_5$)$_3$Al) (hereinafter referred to as TEA) is used as an aluminum source gas for the growth of AlGaAs by the GSMBE method. This source gas has strong chemical bonds between aluminum and carbon atoms. As a result of this, when this source gas pyrolytically decomposes, large amount of carbon gets easily included in an AlGaAs epitaxial layer. Therefore, the carbon concentration of an AlGaAs layer grown by this technology is higher than that of a GaAs layer grown from TMG or TEG as described above. Moreover, TEA includes volatile oxides impurities, such as (C$_2$H$_5$)$_3$AlOC$_2$H$_5$ which are produced during the production process of TEA. Oxygen of these impurities is often incorporated into a growing layer. These problems degrade the quality, in particular electric characteristics, of AlGaAs crystal.

In contrast, in the case of trimethyl amine alane, carbon has less possibility to be included in an epitaxial growth layer, due to the fact that while trimethyl amine alane ((CH$_3$)$_3$N.AlH$_3$) decomposes into alkyl amine ((CH$_3$)N) and aluminum hydride (AlH$_3$), (CH$_3$)N is chemically stable. Besides, because no oxides are produced as by-products during the production process of trimethyl amine alane, the concentration of oxygen impurity in a grown layer is less than in the case where TEA is used.

For the above reasons, Abernathy et al. concluded in their report that when trimethyl amine alane is used as a source gas, the oxygen and carbon concentrations are reduced approximately to 1/1000 and 1/10, respectively, of those obtained when TEA is used. According to their report, in spite of the fact that TEG was used as a source gas for gallium, a large amount of reduction in carbon concentration was achieved as described above.

On the other hand, regarding source gases for anionic elements, tris-dimethylamino arsine (As(N(CH$_3$)$_2$)$_3$), which is an arsenic organic compound of low toxicity, has been tried for an arsenic source instead of highly toxic arsine. This is disclosed, for example, in a paper entitled "Crystal Growth of GaAs by MOMBE using a new As precursor"(T. Koui, et at., Extended Abstract for the 38th Spring Meeting, 1991 of the Japan Society of Applied Physics and Related Societies, p297).

This paper states that a GaAs epitaxial layer can be grown by using tris-dimethylamino arsine as an arsenic source and using TEG as a gallium source. However, it is reported that n-type carrier concentration of the order of $10^{17}$ cm$^{-3}$ was observed in the grown GaAs layer. It has been believed that ethyl radicals are produced as a result of the decomposition of TEG and these ethyl radicals are incorporated into a growing layer, and furthermore carbon atoms of the ethyl radicals occupy Ga sites to generate n-type carriers.

As described above, it is possible to grow an epitaxial layer of compound semiconductor crystal, such as GaAs, AlGaAs and the like, by using an amine compound as a source gas. Furthermore, the possibility is indicated that the carbon concentration included in a grown layer is reduced. However, the growth rates reported in both papers on an AlGaAs layer by Albernathy et al. and on a GaAs layer by T. Koui et al. are approximately 3000 A/hr which are not sufficiently high for practical applications. The reason for such low growth rates is that a sufficiently large amount of source gas cannot be supplied to the surface of a substrate due to the fact that the vapor pressure of amine compounds described above is, in general, as low as 1–2 Torr at a range of room temperature and the fact that the decomposition temperature is also as low as about 40° C. Even if these amine compounds are heated up to a temperature than 40° C. with the intention of rasing the vapor pressure, unfortunately the intention cannot be achieved because these amine compounds will decompose.

SUMMARY OF THE INVENTION

It is an object of the present invention to solve the problems described above. More specifically, it is an object of the present invention to provide a growth method and apparatus which reduce the amount of the inclusion of impurity atoms such as carbon and oxygen in a grown layer, and which enable a high purity semiconductor crystal layer to be grown at efficiently high rates.

The basic idea of the present invention is based on the fact that when GaAs epitaxial layer is grown on a GaAs crystal substrate by the GSMBE method using TEG and AsH$_3$ as source gases, the growth rate of GaAs layer depends on an ambient gas pressure (Refer to J. Saito et al., "Background pressure dependence of GaAs and AlGaAs growth rates in gas-source molecular beam epitaxy", Extended Abstracts for the 51th Autumn Meeting 1990 of the Japan Society of Applied Physics, p246). Referring to FIG. 6, this will be described in more detail.

FIG. 6 is a graph showing the dependence of GaAs and AlGaAs growth rates on AsH$_3$ flow rates for the case where epitaxial growth is carried out by the GSMBE method using an apparatus similar to that in FIG. 5. Regarding the GaAs growth rate, 0.8 µm/hr is obtained for the AsH$_3$ flow rate of 5 sccm, while the GaAs growth rate decreases as the AsH$_3$ flow rate increases and it becomes about 0.4 µm/hr when the AsH$_3$ flow rate is 50 sccm. The other growth conditions are as follows: the distance between a substrate and gas effusion cells is 25 cm; the substrate temperature during growth is 550° C.; and the TEG flow rate is 2.5 sccm. As shown in FIG. 6, a similar tendency can be seen for the case where AlGaAs is grown by using triethyl aluminum ((C$_2$H$_5$)$_3$Al) and AsH$_3$ as source gases.

In the growth described above, the ambient gas pressure increased from $7 \times 10^{-5}$ Torr to $7 \times 10^{-4}$ Torr in proportion as the AsH$_3$ flow rate increased from 5 sccm to 50 sccm. This result was analyzed based on the kinetic theory of gases. The analysis indicated that the reduction in the growth rate results from the reduction in the amount of TEG molecules which occurs when the TEG molecules are scattered by the collision with the gas particles in the atmosphere during their travel from a gas effusion cell to a substrate. Furthermore, the analysis also suggests that the ambient gas pressure consists mainly of the partial pressure of hydrogen (H$_2$) molecules which are produced as a by-product when arsenic (As$_2$) is produced by the pyrolysis of AsH$_3$.

This result leads to an important idea on the design of a growth chamber 1 (FIG. 5) for a GSMBE apparatus. That is, to obtain a high growth rate, it is needed to make the distance between a gas effusion cell and a substrate sufficiently short compared to the mean free paths of gases composing the atmosphere. When the pressure of a gas is given by P (Torr), the mean free path (λ) of the gas particle is given by $$\lambda = 2.33 \times 10^{-20}(T/(P.d^2))(cm) \quad (1)$$

where T is a temperature of the gas, d is a diameter (cm) of the gas particle. Now, let us assume that these parameters can be typically described as follows: P is $2 \times 10^{-3}$ Torr, T is equal to the temperature of the gas effusion cell, 350K, and d is equal to the diameter of a hydrogen molecule, $2.75 \times 10^{-8}$ cm. If these parameters are substituted into equation (1), then we can get λ=5.4 cm. Therefore, when the ambient gas pressure during the growth is $2 \times 10^{-3}$ Torr, if the distance between a gas effusion cell and a substrate is made less than the above value of λ, then it is possible to avoid the reduction in growth rate due to the scattering of the source gas molecules with the ambient gas as in the case of FIG. 6. Moreover, it is possible to reduce the possibility that the decomposed gases in the atmosphere acting as a contamination source of carbon are incorporated into a growing epitaxial layer.

According to Abernathy et al., as described above, if triethyl amine alane is used as a source gas for aluminum, inclusion of impurities such as carbon and oxygen in a grown layer can be reduced. Moreover, as described above, if tris-dimethylamino arsine (As(N(CH$_3$)$_2$)$_3$) is used, the use of highly toxic AsH$_3$ can be avoided. However, as discussed above, these amino compounds cannot be used in the conventional GSMBE method, because their vapor pressures are too low at room temperatures. Therefore, it is impossible to obtain efficiently high molecular beam intensity at the surface of a substrate.

In the GSMBE apparatus in accordance with the present invention, in view of the above, the distance between gas effusion cells (molecular beam source) and a substrate is made sufficiently short to obtain such a high molecular beam intensity at the surface of the substrate, thus it becomes possible to achieve the growth rate high enough for practical applications in spite of the use of amino compounds having low vapor pressures as source gases. More specifically, the distance L between a gas effusion cell and a substrate is set so that the product of the pressure (P) and the distance (L) becomes less than $1 \times 10^{-2}$ cm. Torr, or L.P<$1 \times 10^{-2}$ cm. Torr under the growth condition of normal ambient pressure in the range from $10^{-4} - 10^{-3}$ Torr. Thus, the effect of scattering with the ambient gases can be neglected even in the case where source gases having heavier molecular weight than hydrogen are used.

When the distance between a substrate and a gas effusion cell is made short as described above, the influence of heat radiation from the substrate on the gas effusion cell might be a new problem. In other words, because of the increase in the temperature of the effusion cell due to the heat radiation, the source gas molecules might decompose or might be adsorbed at the effusion cell. To avoid this, in the present invention, a plate for heat insulation is provided between the substrate and the effusion cell, furthermore a cooling and heating system is provided to maintain the gas effusion cell at a desired temperature.

In this way, the present invention enables the GSMBE method to use amino compounds as a source gas for any element in III or V group. The alkyl groups such as $CH_3-$ and $C_2H_5-$ which cause the inclusion of carbon in the conventional GSMBE method are replaced by the alkylamine groups such as $(CH_3)N-$ and $(C_2H_5)_3N$ which lead to the less carbon impurity concentration in the grown layer. Thus, the problems in the conventional GSMBE method are solved.

In conclusion, the aspects of the present invention are as follows:

1. The distance between a source gas effusion cell and a substrate is set to a distance less than the mean free path of the molecules of the ambient gases in a growth chamber. As a result of this, the probability and the absolute amount of arrival of the source gas at the growing surface of the substrate are raised. Therefore, it becomes possible to use amine-based gases as a source for epitaxial growth at a high growth rate.

2. A heat insulation plate having the aperture corresponding to the aperture of the gas effusion cell is provided between the gas effusion cell and the substrate, so that the increase in the temperature of the gas effusion cell due to the heat radiation from the heated substrate can be suppressed and so that the decomposition of the source gas in the effusion cell or around it can be avoided.

3. A cooling or heating system is provided for maintaining the source gas effusion cell at a desired temperature so that the influence of the heat radiation from the substrate can be avoided more effectively.

4. The effusion cells are separated from each other between those for the source of the elements composing the growing crystal and those for the source of doping impurity. As a result of this, it becomes possible to make absolutely spontaneous switching of effusion cells between ones for growth and ones for doping. Thus, the influence of the residual doping impurities is reduced and abrupt impurity concentration profile can be achieved in the growing epitaxial layer.

5. The portion in the vicinity of the aperture of each gas effusion cell is tapered. As a result of this, the source gas is supplied with good uniformity across the surface of the growing layer. Thus, the epitaxial growth with good uniformity can be achieved on a large size substrate.

Incidentally, a technology called VCE (vacuum chemical epitaxy) has been proposed in which the semiconductor epitaxial layer is grown with source gases effused from a plurality of orifices which are provided so that these orifices face the surface of the substrate ((1) L. M. Fraas et al., "Epitaxial growth from organometallic sources in high vacuum" Journal of Vacuum Science & Technology B4, January/February pp.22–29, 1986; (2) L. M. Fraas et al., "HIGH THROUGHPUT VACUUM CHEMICAL EPITAXY" Journal of Crystal Growth 105, pp.35–45, 1990; (3)S. Kuromiya et al., "Development of Vacuum Chemical Epitaxy Systems (in Japanese)" Solid State Technology/Japanese edition, February pp.21–27, 1990).

In the present invention, the epitaxial layer is grown with the source gases effused from the gas effusion cells arranged in the vicinity of the substrate as described above. Therefore, the present invention might seem to have the apparatus structure similar to that of the VCE method. However, in the VCE method, the above orifices or the orifice plates around the orifices are heated by radiation from the substrate up to the temperature approximately the same as the temperature of the substrate. This is called a hot wall type structure. On the other hand, as will be seen later, the present invention has a cold wall structure. In other words, in the present invention, heat insulation plates or shrouds are provided so as to block off the heat radiation from the substrate to the gas effusion cells or manifold blocks connected to these effusion cells. Thus, the present invention is based on the absolutely different design philosophy.

DESCRIPTION OF THE PREFERRED EMBODIMENTS

Figure 1:
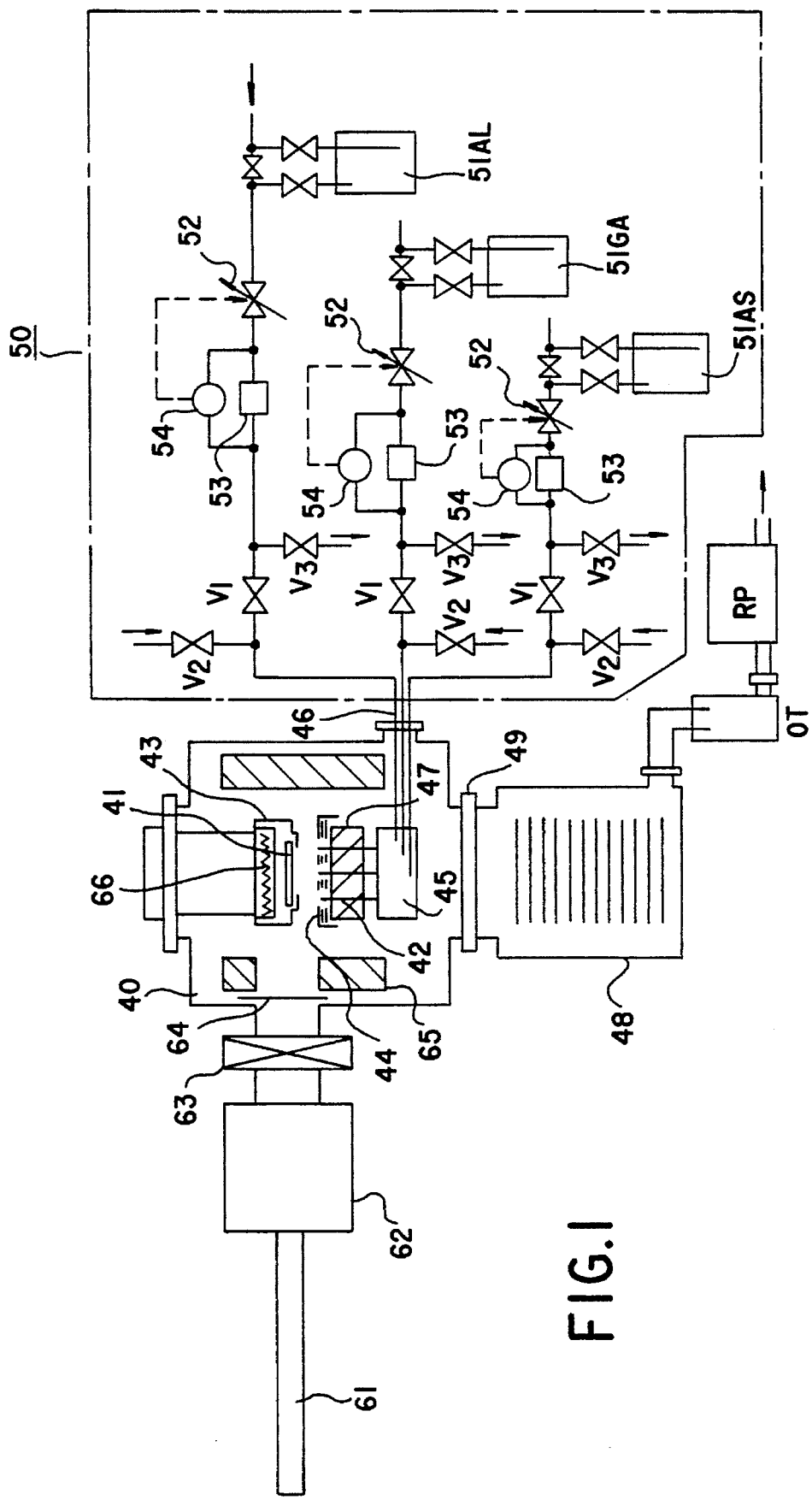
FIG. 1 is a block diagram showing the general construction of a GSMBE apparatus in accordance with the present invention.
Figure 2A:
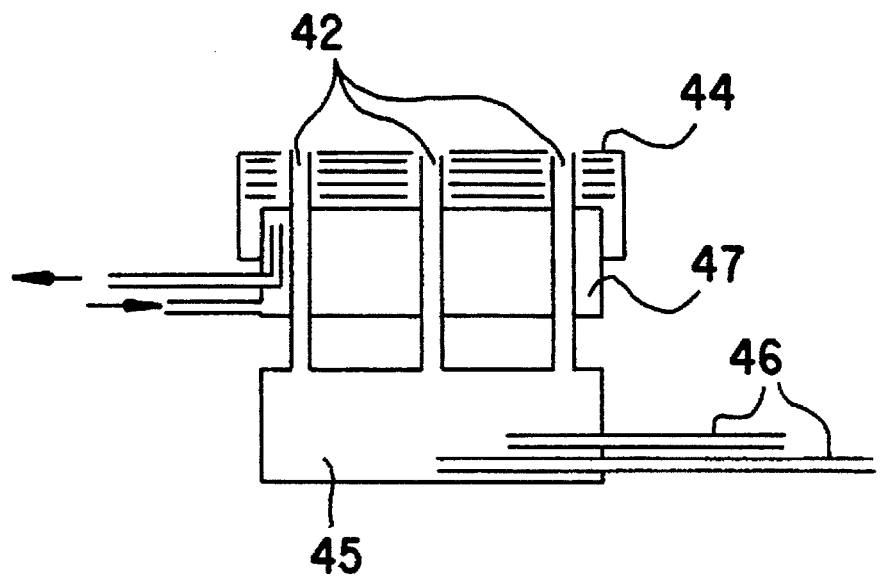
FIGS. 2(a) and 2(b) are a cross sectional view and a partial plan view of a gas effusion cell and a heat insulation plate, respectively, used in FIG. 1, showing the detailed structure of these members.
Figure 2B:
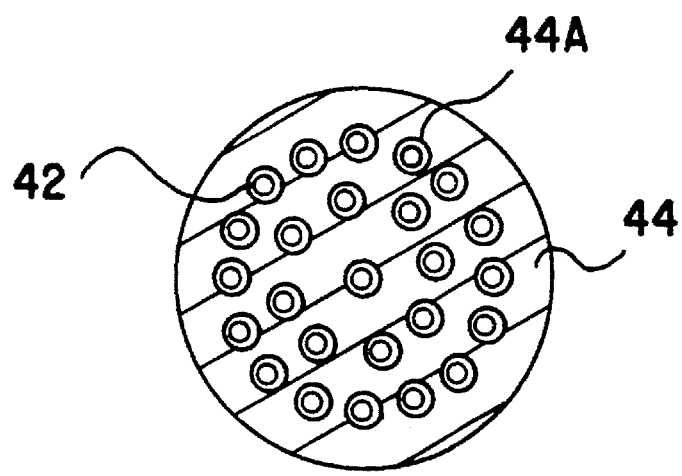

Now, preferred embodiments of the present invention will be described. FIG. 1 is a schematic diagram showing the construction of an embodiment of a GSMBE apparatus in accordance with the present invention. FIGS. 2(a) and 2(b) are schematic diagrams showing the detail of a gas effusion cell and a heat insulation plate for use in the apparatus of FIG. 1.

Referring to FIG. 1, in a vacuum chamber (crystal growth chamber) 40 made of for example stainless steel and having the size of approximately 30 cm in diameter and 40 cm in height, a substrate 41 made of for example GaAs single crystal is provided and a plurality of gas effusion cells 42 having the form of pipe is also provided in such a way that these cells are opposed to the substrate. The substrate 41 is supported by a substrate holder 43 so that the surface of the substrate 41 on which the epitaxial layer is to be grown faces the gas effusion cells 42 and so that the substrate 41 is located at the predetermined distance from the gas effusion cells 42. This distance is set to a distance less than the mean free path (λ) given by equation (1), as described above. Heat insulation plates 44 are provided between the substrate 41 and gas effusion cells 42. In order to assure the effect of the heat insulation plates 44, there are provided plural plates which are distant from each other at certain intervals.

The inside of the vacuum chamber 40 is evacuated with a turbo molecular pump 48. Its ultimate pressure is in the range from $10^{-10}$ to $10^{-11}$ Torr. There is a gate valve 49 between the vacuum chamber 40 and the turbo molecular pump 48. RP represents an auxiliary rotary pump and OT represents an oil trap.

As shown in FIG. 2(a), each of gas effusion cells is composed of a pipe having an inner diameter of 6 mm. There are, for example, twenty five cells arranged in the form of a matrix at the intervals of 6–12 mm. One end of each gas effusion cell 42 is connected to a manifold block 45 in the form of a hollow cylinder. Source and doping gases are supplied at predetermined flow rates to the manifold block 45 via gas entrance pipes 46 which are provided for individual different gases. The gas effusion cells 42 are maintained at the predetermined temperature with a shroud 47 in the form of a hollow cylinder through which hot or cold water is circulated. More specifically, the gas effusion cells 42 are provided through the shroud 47 and they are fixed to a case composing the shroud 47 by means of welding or the like.

The outmost one of the heat insulation plates 44 is located slightly apart above the gas effusion cells 42. Each of the heat insulation plates 44 is composed of 0.3 mm thick disc having a diameter of about 10 inch. There are apertures 44A having a diameter of 5–7 mm, corresponding to the gas effusion cells 42 as shown in FIG. 2(b), for allowing the gas effusion cells to pass therethrough except openings formed in the outermost one of the heat insulation plates 44. Peripheries of some of these heat insulation plates 44, for example five plates of these, are fixed to the shroud 47. Preferably, the heat insulation plates 44 and the manifold block 45 are designed so that these have approximately the same diameters as shown in FIG. 2(a). The heat insulation plates 44, having such a structure, block off the heat radiation entering the gas effusion cells 42 and the manifold block 45 from the substrate 41.

Incidentally, the above gas effusion cells 42 and the heat insulation plates 44 are made of high melting point metal such as tantalum, and the manifold block 45, the gas entrance pipes 46, and shroud 47 are made, for example, of stainless steel.

Referring again to FIG. 1, the gas entrance pipes 46 are connected to a gas supply system 50 for supplying source gases for the growth and doping source gases at predetermined rates. To illustrate an example, the gas supply system 50 in FIG. 1 is assumed to be adapted for use in the growth of GaAs or AlGaAs. The doping source gases are not shown in this figure for simplicity. To purge the residual gases in gas supplying lines and in source gas cylinders, there are connections for introducing hydrogen gas at the end of each gas supplying line which is connected to cylinders 51.

Figure 5:
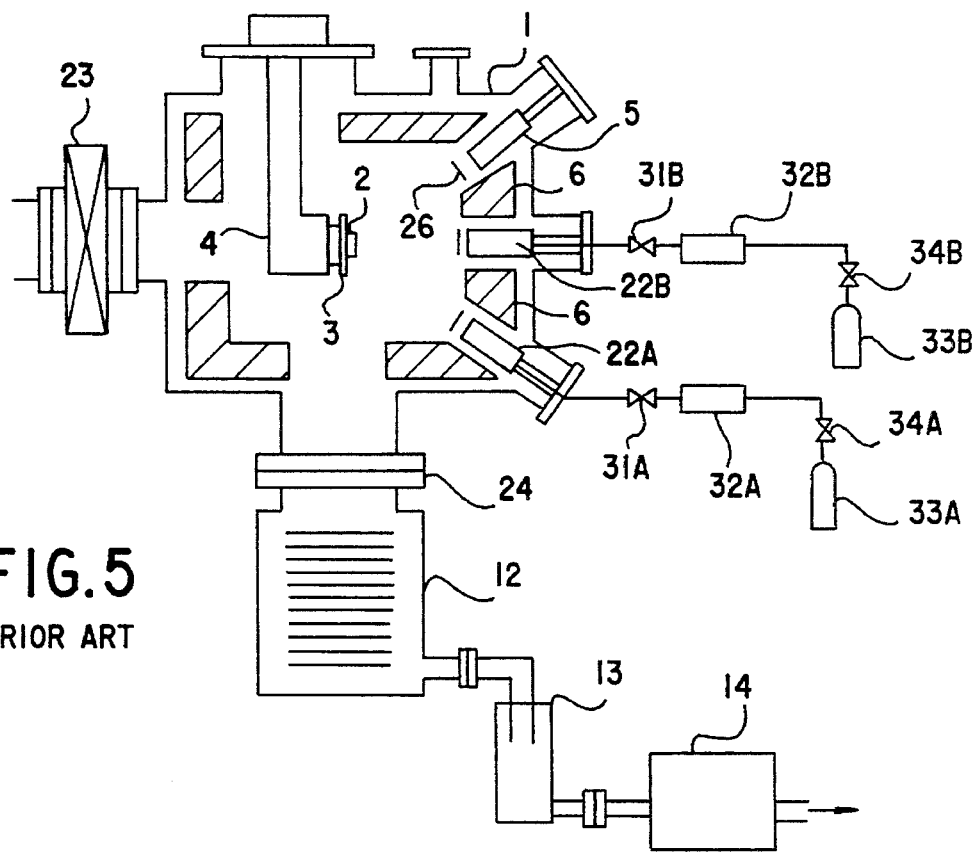
FIG. 5 is a block diagram for explanation of the problems in a conventional GSMBE method.
Figure 6:
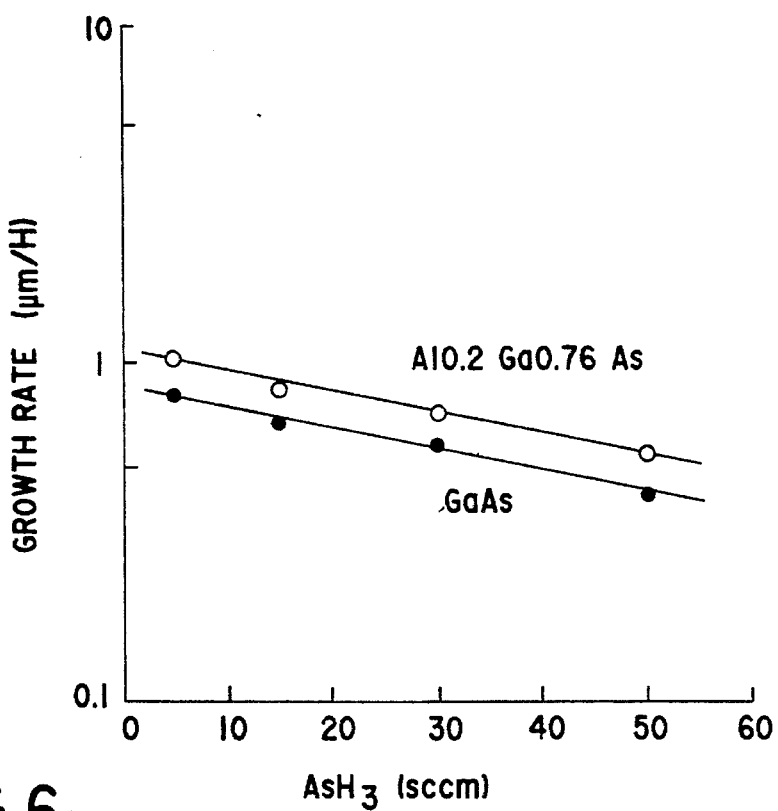
FIG. 6 is a graph showing the dependence of the GaAs and AlGaAs growth rate on the $AsH_3$ flow rate for the case of a conventional GSMBE method.

Cylinders 51AL, 51GA, and 51AS filled with trimethyl amine alane, trimethyl amine galane, and tris-dimethylamino arsine are provided for supplying gases for sources of Al, Ga, and As. Mass flow controllers are used broadly as a means for controlling gas flow in common MOCVD methods and also in the apparatus of the conventional GSMBE method as in FIG. 5. However, mass flow controllers cannot be used for the present invention, because the vapor pressures of these amine compounds are as low as 1–2 Torr in the range of room temperatures. Therefore, there is provided a gas control system comprising variable leak valve 52, flow element 53, and pressure sensor 54, for each source gas line so as to precisely control the flow of gases having such low pressures. In this gas control system, the pressure sensor 54 detects the pressure difference across the flow element 53 having known conductance, then the flow rate is determined from this pressure difference. Furthermore, the variable leak valve 52 is controlled so that the pressure difference becomes a value corresponding to a predetermined flow rate. The variable leak valve 52 was controlled with a stepping motor (not shown).

Now, an embodiment will be described in which the above GSMBE apparatus is used for the growth of GaAs and AlGaAs layers on the (100)-surface semi-insulating GaAs substrate 41. Trimethyl amine galane (($CH_3)_3N.GaH_3$), trimethyl amine alane (($CH_3)_3N.AlH_3$), and tris-dimethylamino arsine ($As(N(CH_3)_2)_3$) are used as source gases. The entire gas supply system 50 is maintained at 30° C. The substrate 41 is transferred into a substrate exchange chamber 62 with a substrate transfer system 61 using for example a magnetic coupling method, under the atmospheric pressure. When a pumping system (not shown) evacuates the inside of the substrate exchange chamber 62 to a pressure as low as $10^{-8}$–$10^{-9}$ Torr, the gate valve 63 is open and the substrate 41 is transferred into the vacuum chamber 40. After the substrate 41 is set on the substrate holder 43 in this way, the gate valve 63 and the shutter 64 are closed. Hot water having a temperature of 40° C. is supplied through a shroud 65 provided along the inner wall of the vacuum chamber 40. Hot water having a temperature of 40° C. is also supplied through the shroud 47. Decomposed gases are adsorbed on the shroud 65 which is maintained at such a temperature and they do not re-evaporate. As a result of this, a high purity layer can be grown.

The gate valve 49 is always open so that the inside of the vacuum chamber 40 is always evacuated with the turbo molecular pump 48. Under such a condition, tris-dimethylamino arsine is supplied at a flow rate of 2 sccm to the manifold block 45 via the gas entrance pipes 46 from the gas supply system 50. As a result of this, tris-dimethylamino arsine is effused from the gas effusion cells 42 and the pressure inside the vacuum chamber 40 reaches $2 \times 10^{-3}$ Torr. Under this condition, the substrate 41 is heated up to 600° C. with a substrate heater 66. Ten minute heating under this condition removes the native oxides from the surface of the substrate 41.

While the tris-dimethylamino arsine is continued to be supplied, the substrate heater 64 is adjusted so that the temperature of the substrate 41 are lowered down to 550° C., then trimethyl amine galane is supplied at a flow rate of 0.5 sccm to the manifold block 45 via the gas entrance pipes 46 from the gas supply system 50. This makes the trimethyl amine galane effused from the gas effusion cells 42. This effused trimethyl amine galane reacts with the tris-dimethylamino arsine at the surface of the substrate 41 and GaAs is grown there. Incidentally, the introduction of the trimethyl amine galane results in a slight increase in the pressure inside the vacuum chamber 40 up to $2.2 \times 10^{-3}$ Torr.

At this stage, there is a mixture of the tris-dimethylamino arsine and the trimethyl amine galane in the manifold block 45. Hence, there is some possibility that this mixture gas may go back into each of gas supply lines via the gas entrance pipes 46. To avoid this, hydrogen is always supplied through the gas entrance pipes 46 except when the source gases are supplied to the GSMBE apparatus. For this purpose, the hydrogen gas whose flow rate is controlled by the mass flow controller (not shown) is supplied via hydrogen supply valves $V_2$ one end of which is connected to a point between a gas supply valve $V_1$ of each gas supply line and the gas entrance pipe 46. As described above, for the case where GaAs is grown, tris-dimethylamino arsine and trimethyl amine galane are supplied at flow rates of 2 sccm and 0.5 sccm, respectively, while hydrogen is supplied at a flow rate of 0.2 sccm through the gas supply line for trimethyl amine alane via the corresponding hydrogen supply valve $V_2$. Therefore, the total flow rate of the gas to the vacuum chamber 40 is 2.7 sccm, and the gas pressure inside the vacuum chamber 40 was observed to be $2 \times 10^{-3}$ Torr. After GaAs was grown for 30 minutes in this way, the hydrogen supply valve $V_2$ and a vent valve $V_3$ both of which are connected to the gas supply line of trimethyl amine alane are closed, and spontaneously the corresponding gas supply valve $V_1$ are open so that trimethyl amine alane is introduced into the vacuum chamber 40 through the gas entrance pipe 46. Then the trimethyl amine alane is effused from the gas effusion cells 42 toward the substrate 41, on which AlGaAs is grown. Prior to the introduction into the vacuum chamber 40, the flow rate of trimethyl amine alane has been adjusted to 0.2 sccm by the flow control system comprising the flow element 53, the pressure sensor 54, and the variable leak valve 52, while the trimethyl amine alane is evacuated into a vent line through an opened vent valve $V_3$ connected to the corresponding gas supply line during the above adjustment process. Thus, the switching can be easily carried out between the valve $V_2$ for supplying hydrogen and the valve $V_1$ for supplying the source gas. Moreover, the disturbance of the above switching to the pressure inside the vacuum chamber 40 can be reduced.

After AlGaAs was grown for 30 minutes in a way described above, both the gas supply valves $V_1$ for supplying trimethyl amine galane and trimethyl amine alane are closed, and spontaneously each of the corresponding valves $V_2$ for supplying hydrogen is opened, while tris-dimethylamino arsine is continued to be supplied. Then, electric power supply to the substrate heater 66 is stopped. When the temperature of the substrate becomes lower than 400° C., the supply of tris-dimethylamino arsine and hydrogen is stopped. Furthermore, the vacuum chamber 40 is evacuated until the pressure becomes in the order of $10^{-8}$ Torr, then the gate valve 63 and the shutter 64 are opened. The substrate 41 is transferred to the substrate exchange chamber 62 with the substrate transfer system 61. After that, the gate valve 63 is closed and the pressure inside of the substrate exchange chamber 62 is made raised up to the atmospheric pressure so that the substrate 41 is taken out.

In this way, the GaAs and AlGaAs epitaxial layers were obtained whose thicknesses are 0.3 μm and 0.4 μm. The carbon and oxygen concentrations included in these GaAs and AlGaAs layers were analyzed using the SIMS (secondary ion mass-spectrometer). The resultant concentrations of carbon and oxygen were less than the detection limit ($2 \times 10^{16}$ cm$^{-3}$ for carbon, $1 \times 10^{17}$ cm$^{-3}$ for oxygen) of the SIMS for both of the GaAs and AlGaAs layer. These concentrations are less than 1/10–1/100 of the carbon and oxygen concentrations detected in the GaAs and AlGaAa layers grown by the conventional GSMBE method using TMG, TMA, and AsH$_3$ as source gases with the apparatus shown in FIG. 5. Thus, it has been proved from this result that high purity GaAs and AlGaAs epitaxial layers can be grown by the method and the apparatus in accordance with the present invention. Furthermore, the uniformity of the thickness was excellent such as less than ±1% across the wafer for both of the GaAs and AlGaAs layers which are grown according to the present invention on wafers having a diameter of 4-inch.

The growth of a n-type GaAs layer using the method and the apparatus in accordance with the present invention can be achieved by modifying the apparatus such that the gas supply line for supplying amino compounds of silicon as a source gas is added to the gas supply system 50. Now, as another embodiment, the growth of n-type GaAs epitaxial layer on a GaAs substrate for use in GaAs MESFET will be described.

As in the previous embodiment, a substrate 41 made of GaAs crystal is set on the substrate holder 43. While tris-dimethylamino arsine is supplied at a flow rate of 2 sccm into the vacuum chamber 40, this substrate 41 is heated up to 600° C. By heating the substrate for 10 minutes under this condition, the native oxides are removed from the surface of the substrate 41. After the temperature of the substrate 41 is lowered down to 550° C., trimethyl amine galane is supplied at a flow rate of 0.5 sccm for about 60 minutes. As a result of this, non-doped GaAs having a thickness of about 1 μm is grown. Then, a gas supply valve $V_1$ (not shown) is opened for supplying tetrakis-diethyl amino silane ($(N(C_2H_5)_2)_4.Si$) as a source gas of an amino silicon compound, and this condition is maintained for about 30 minutes. Thus, a 0.3 μm thick n-type GaAs layer is grown. In the above process, the tetrakis-diethyl amino silane is diluted with high purity hydrogen gas to about 1%, then this diluted gas is supplied at a flow rate of 2 sccm. Under this condition, the pressure inside the vacuum chamber 40 was observed to be about $4 \times 10^{-3}$ Torr.

After that, both of gas supply valves for trimethyl amine galane and tetrakis-diethyl amino silane are closed at the same time. Then the supply of the electric power to the substrate heater 66 is stopped. After the temperature of the substrate 41 is lowered down to 400° C., the gas supply valve for tetrakis-diethyl amino silane is closed. Then, the vacuum chamber 40 is evacuated until the pressure reaches the order of $10^{-8}$ Torr. After that, the substrate 41 is transferred to the substrate exchange chamber 62 to take out the substrate 41.

In the above process, tetrakis-dimethyl amino silane ($(N(CH_3)_2)_4Si$) can be used instead of tetrakis-diethyl amino silane. Furthermore, when p-type GaAs is grown, impurity source gases such as trimethyl amine zilane ($(CH_3)_3N.ZnH_2$) and triethyl amine zilane ($(C_2H_5)_3N.ZnH_2$) are available.

The Hall measurement was carried out for the GaAs layer grown in a way described above. The resultant electron concentration and mobility of the n-type GaAs were $1.5-10^{17}$ cm$^{-3}$ and 4500 cm$^2$/Vsec, respectively. This result shows that the high quality epitaxial layer for GaAs MESFET can be obtained. In the method and apparatus in accordance with the above embodiment, after the gases for the sources of elements composing the semiconductor to be grown and the source gases for doping impurities are mixed in the manifold block 45, the resultant mixed gas is effused from the effusion cells 42, as shown in FIGS. 1 and 2(*a*). In contrast, in another embodiment which will be described next, separate individual manifold blocks 45 and gas effusion cells 42 are provided for each source gas.

Figure 3:
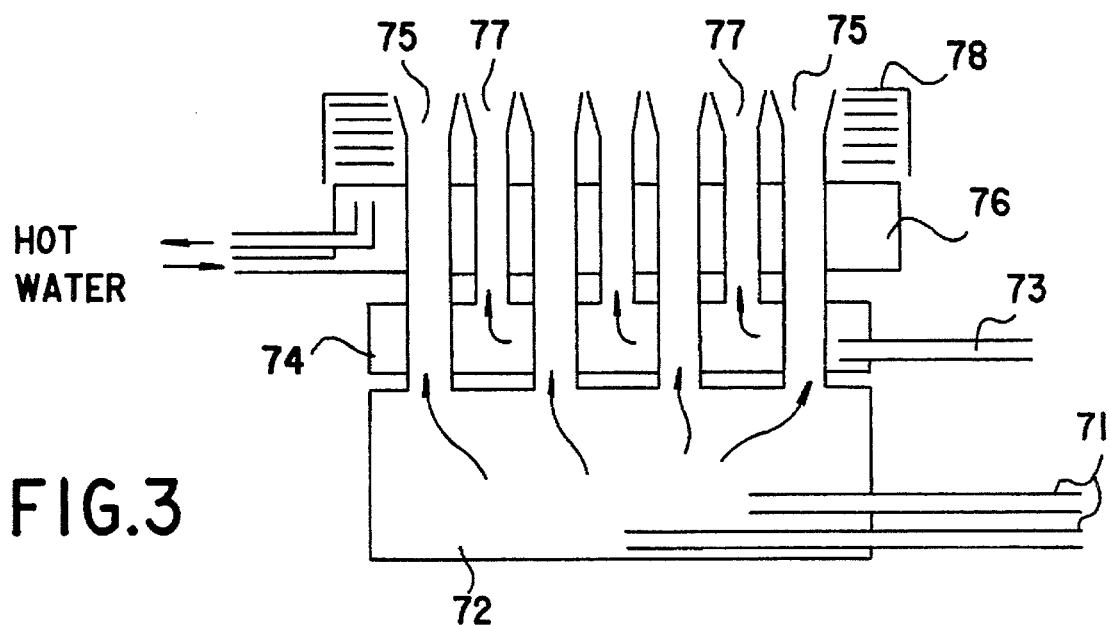
FIG. 3 is a cross sectional view showing gas effusion cells of another embodiment for use in the apparatus of FIG. 1.

FIG. 3 is a cross sectional view showing the main portion of this embodiment. In this embodiment, there is provided a manifold block 72 to which gas entrance pipes 71 for source gases of elements composing semiconductor are connected. A manifold block 74 with a gas entrance pipe 73 for the source gases of doping impurity is also provided above the manifold block 72 in such a manner that the manifold blocks 72 and 74 compose a two-level structure. Gas effusion cells 75 are connected to the manifold block 72 through the manifold block 74 and also through a hot water shroud 76 which is provided above the manifold block 74. Furthermore, gas effusion cells 77 are connected to the manifold block 74 through the hot water shroud 76. These gas effusion cells 75 and 77 are arranged in such a manner that the central axis of each cell is parallel to each other. Above the hot water shroud 76, there are provided a plurality of heat insulation plates 78 put one above another with an adequate space. The structure of the gas effusion cells 75 and 77 are designed in such a manner that at least the inner wall (not shown) in the vicinity of the aperture is tapered to form a part of a conical surface which expands gradually toward the substrate. The angle between the central axis and the conical surface, or the angle of aperture, of these gas effusion cells, is approximately 5°. The taper of such a shape enables the uniform effusion of the source gases for semiconductor component elements and the source gases for doping impurities from the gas effusion cells toward the surface of the substrate. Incidentally, as a matter of course, the heat insulation plates 78 have apertures corresponding to the gas effusion cells 75 and 77.

Figure 4:
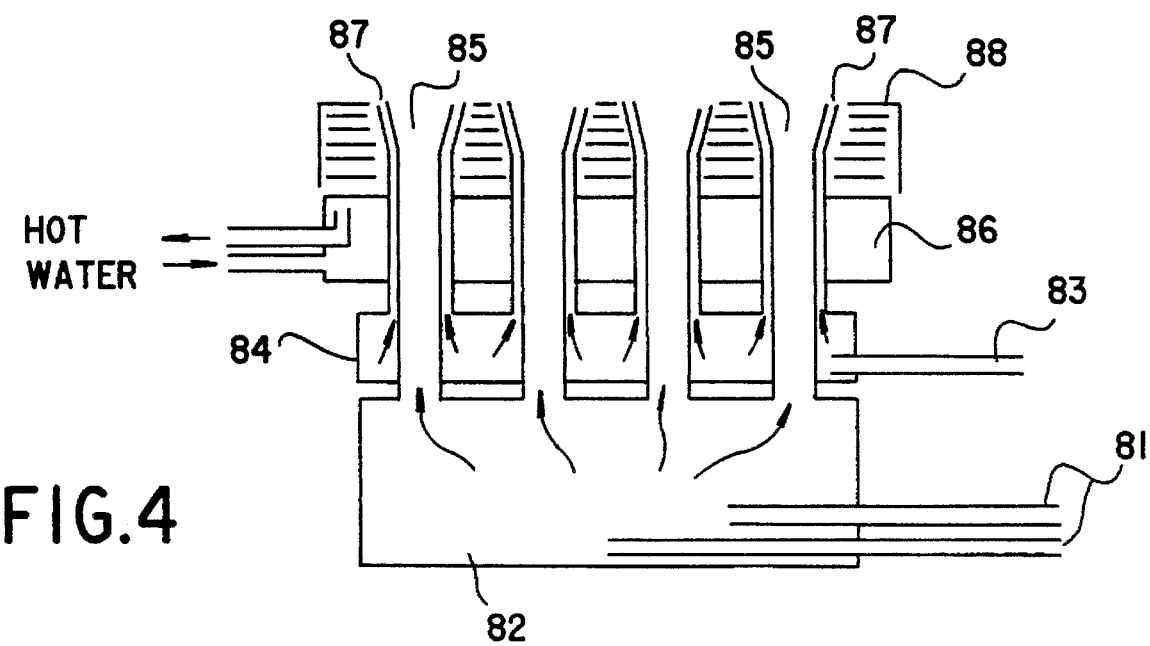
FIG. 4 is a cross sectional view showing gas effusion cells of further another embodiment for use in the apparatus of FIG. 1.

FIG. 4 is a cross sectional view of a main portion of further another embodiment. As in FIG. 3, there is provided a manifold block 82 to which gas entrance pipes 81 for source gases of semiconductor component elements are connected. A manifold block 84 with a gas entrance pipe 83 for the source gases for doping impurities is also provided above the manifold 82 in such a manner that the manifold blocks 82 and 84 compose a two-level structure. Gas effusion cells 85 are connected to the manifold block 82 through the manifold block 84 and also through a hot water shroud 86 which is provided above the manifold block 84. Furthermore, gas effusion cells 87 are connected to the manifold block 84 through the hot water shroud 86. The gas effusion cells 85 and 87 have a taper of about 5° in the vicinity of their apertures. In the present embodiment, the gas effusion cells 85 and 87 are arranged in such a manner that the central axis of each cell coincides with each other, in other words, the gas effusion cells 85 are located inside the gas effusion cells 87. As a result of this structure, the source gases for semiconductor component elements, which are introduced into the manifold block 82 through the gas entrance pipes 81, are effused from the apertures tapered in the form as described above, passing through the space between the gas effusion cells 85 and 87. Above the hot water shroud 86, there are provided a plurality of heat insulation plates 88 put one above another with an adequate space. Incidentally, as a matter of course, these heat insulation plates 88 have apertures corresponding to the gas effusion cells 87.

Preferably, the optimum angle of aperture of the open end of each gas effusion cell shown in FIGS. 3 and 4 can be determined experimentally, depending on the diameter of the substrate, growth conditions such as ambient gas pressure during the growing process, and source gases for semiconductor component elements or for doping impurities. In the case of the gas effusion cells as in FIG. 4, the angles of aperture of the cells 85 and 87 need not to be the same. Each of these cells can have different angle of aperture as long as there is no interference between the source gases effused from each aperture.

In the above embodiments, the growth of GaAs or AlGaAs epitaxial layer on a GaAs substrate is described as an example, but the present invention is not limited to those materials. InP or GaSb and the like can be used as a substrate material, and epitaxial layers of binary, ternary, or quarternary alloys such as InP, InGaP, InGaAs, InAlAs, GaSb, InGaSb, InAlSb, InGaAsP, and the like can be grown. Moreover, the present invention can be applied to the growth of GaAs or SiGe epitaxial layers on a substrate of silicon single crystal. In these cases, as a matter of course, amino compounds are used as source gases for In, P, Sb or Ge. For example, trimethyl amine ilane $((CH_3)_3N.InH_3)$ or triethyl amine ilane $((C_2H_5)_3N.InH_3)$ can be used as a source gas for In, and tris-dimethylamino phosphine $(P(N(CH_3)_2)_3)$ or tris-diethylamino phosphine $(P(N(C_2H_5)_2)_3)$ can be used for a source gas for P. As source gases for Sb and Ge, trimethyl amine antylane $((CH_3)_3N.SbH_5)$ and trimethyl amine germane $((CH_3)_3N.GeH_4)$ can be used, respectively.

As described above, in the growth of compound semiconductor crystal using a GSMBE apparatus in accordance with the present invention, the distance between a substrate on which crystal is to be grown and a gas effusion cell is made short enough to avoid the carbon contamination due to the incorporation of decomposed source gases into a growing layer as in the case of a conventional GSMBE method, and to reduce the scattering of the source gas molecules with the ambient gas molecules. Besides, the sufficiently strong molecular beam intensity is achieved at the surface of a substrate in spite of the use of amino compounds having low vapor pressure as a source gas. Moreover, the source gas decomposition in a gas effusion cell is suppressed by a heat insulating plate provided for blocking off the heat radiation from the substrate, and also by a shroud provided for maintaining a constant temperature. As a result of these, the growth of a high purity compound semiconductor crystal is achieved at a high growth rate. Furthermore, a tapered aperture of a gas effusion cell enables the high uniformity crystal growth on a substrate having a large size. A gas cell for doping impurities is provided separately from the gas cells for the source of semiconductor component elements, thus the influence of residual gas is reduced sufficiently enough to obtain an abrupt profile in the impurity concentration of a grown layer. In the present invention, low toxicity amino compounds can be effectively used as a source gas for arsine or phosphorus.

I claim:

1. An apparatus for growing a semiconductor on a substrate, comprising:

a vacuum chamber in which the substrate is placed to grow thereon the semiconductor, a first plurality of tubular gas effusion cells passing a first source gas to said substrate, said first source gas containing a gaseous compound of an element constituting said semiconductor, said first plurality of tubular gas effusion cells being arranged in said vacuum chamber so as to extend substantially perpendicular toward said substrate for directing said first source gas toward said substrate and receiving said first source gas from the outside of said vacuum chamber;

a heater for heating said substrate at a predetermined temperature; and a plurality of thermal shielding plates disposed adjacent said first plurality of tubular gas effusion cells and said substrate in order to interrupt the thermal radiation from said substrate heated by said heater, each of said plurality of plates having an opening formed at a position thereon corresponding to each of said first plurality of tubular gas effusion cells;

means for maintaining said first plurality of tubular gas effusion cells at a temperature lower than the temperature range where said first source gas decomposes, said temperature maintaining means being thermally connected to said plurality of thermal shielding plates to thereby cool said plurality of shielding plates;

wherein said first plurality of tubular gas effusion cells and said substrate are mutually disposed so as to have a distance therebetween, said distance being shorter than the mean free path of gases in said vacuum chamber at a pressure ranging from $1 \times 10^{-4}$ Torr to $1 \times 10^{-2}$ Torr.

2. An apparatus for growing a semiconductor on a substrate as set forth in claim 1, further comprising:

a second plurality of tubular gas effusion cells for passing a second source gas to said substrate, said second source gas containing a gaseous compound of an impurity element to be doped in said semiconductor, said second plurality of tubular gas effusion cells being arranged to direct said second source gas toward said substrate in said vacuum chamber and receiving said second source gas from the outside of said vacuum chamber, wherein said plurality thermal shielding plates have openings at positions thereon corresponding to each of said second plurality of tubular gas effusion cells;

wherein said second plurality of gas effusion cells and said substrate are disposed so as to have a distance therebetween, said distance being the same as the distance between said first pluralities of tubular gas effusion cells and said substrate.

3. An apparatus for growing a semiconductor on a substrate as set forth in claim 2, wherein said first and second pluralities of tubular gas effusion cells are arranged on a common axis.

4. An apparatus for growing a semiconductor on a substrate as set forth in claim 1, wherein said first plurality of tubular gas effusion cells has an inner wall adjacent to one end thereof, said inner wall comprising a part of a cone extending toward said substrate.

5. An apparatus for growing a semiconductor on a substrate as set forth in claim 3, wherein each of said first and second pluralities of tubular gas effusion cells has an inner wall adjacent to one end thereof, said inner wall comprising a part of a cone extending toward said substrate.

6. An apparatus for growing semiconductor crystal comprising:

a chamber containing a substrate on which a semiconductor crystal is to grow;

a source manifold block, having a gas input to feed a source gas to the source manifold block;

source gas effusion pipes, in gaseous communication with said source manifold block, transmitting gas from said source manifold block at a first end to said chamber at a second end to crystalize the source gas on a substrate;

a temperature maintenance system, surrounding said source gas effusion pipes, maintaining the temperature of said source gas effusion pipes at a desired temperature; and a plurality of insulation plates, spaced in parallel, and placed between said substrate and said temperature maintenance system.

7. The apparatus of claim 6, wherein said temperature maintenance system includes a shroud in which water is circulated.

8. The apparatus of claim 6, wherein each of said plurality of insulation plates have co-axial holes through which one of said source gas effusion pipes is placed.

9. The apparatus of claim 8, further comprising:

a doping manifold block, having a doping gas input to feed a doping gas to the doping manifold block; and doping gas effusion pipes, in gaseous communication with said doping manifold block, transmitting doping gas from said doping manifold block at a first end to said chamber at a second end.

10. The apparatus of claim 9, wherein each of said doping gas effusion pipes is coaxial with one of said source gas effusion pipes.

11. The apparatus of claim 10, wherein each of said plurality of insulation plates is disc-shaped.

12. The apparatus of claim 10, wherein said second end of each of said source effusion pipes is tapered; and said second end of each of said source effusion pipes is tapered.

13. The apparatus of claim 8, wherein the diameters of the co-axial holes in said plurality of insulation plates are larger than the diameters of said source effusion pipes so as to allow for a space between said source effusion pipes and said plurality of insulation plates.

* * * * *